US006878592B1

(12) United States Patent
Besser et al.

(10) Patent No.: US 6,878,592 B1
(45) Date of Patent: Apr. 12, 2005

(54) SELECTIVE EPITAXY TO IMPROVE SILICIDATION

(75) Inventors: Paul R. Besser, Sunnyvale, CA (US); Minh V. Ngo, Fremont, CA (US); Qi Xiang, San Jose, CA (US); Eric N. Paton, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/341,772

(22) Filed: Jan. 14, 2003

(51) Int. Cl.⁷ .................. H01L 21/336; H01L 21/3205; H01L 21/44
(52) U.S. Cl. ................ 438/285; 438/300; 438/592; 438/655
(58) Field of Search ........................ 438/285, 300, 438/592, 655, 682, 685, 663, 683, 700, 590; 257/E21.438, E21.431

(56) References Cited

U.S. PATENT DOCUMENTS

| | | | | | |
|---|---|---|---|---|---|
| 6,160,299 | A | * | 12/2000 | Rodder | 257/408 |
| 6,214,679 | B1 | * | 4/2001 | Murthy et al. | 438/299 |
| 6,274,445 | B1 | * | 8/2001 | Nouri | 438/300 |
| 6,492,216 | B1 | * | 12/2002 | Yeo et al. | 438/197 |
| 6,518,155 | B1 | * | 2/2003 | Chau et al. | 438/592 |

* cited by examiner

*Primary Examiner*—Stacy A. Whitmore
*Assistant Examiner*—Ron Pompey
(74) *Attorney, Agent, or Firm*—Foley & Lardner LLP

(57) ABSTRACT

A transistor architecture utilizes a raised source and drain region to reduce the adverse affects of germanium on silicide regions. Epitaxial growth can form a silicide region above the source and drain. The protocol can utilize any number of silicidation processes. The protocol allows better silicidation in SMOS devices.

22 Claims, 3 Drawing Sheets

SELECTIVE EPITAXY TO IMPROVE SILICIDATION

FIELD OF INVENTION

The present invention relates generally to integrated circuit (IC) fabrication. More particularly, the present invention relates to a design for and a method of improving silicidation of an IC substrate containing germanium.

BACKGROUND OF THE INVENTION

SMOS processes are utilized to increase transistor (MOSFET) performance by increasing the carrier mobility of silicon, thereby reducing resistance and power consumption and increasing drive current, frequency response and operating speed. Strained silicon is typically formed by growing a layer of silicon on a silicon germanium substrate or layer. Germanium can also be implanted, deposited, or otherwise provided to silicon layers to change the lattice structure of the silicon and increase carrier mobility.

The silicon germanium lattice associated with the germanium substrate is generally more widely spaced than a pure silicon lattice, with spacing becoming wider with a higher percentage of germanium. Because the silicon lattice aligns with the larger silicon germanium lattice, a tensile strain is created in the silicon layer. The silicon atoms are essentially pulled apart from one another. Relaxed silicon has a conductive band that contains six equal valance bands. The application of tensile strength to the silicon causes four of the valance bands to increase in energy and two of the valance bands to decrease in energy. As a result of quantum effects, electrons effectively weigh 30 percent less when passing through the lower energy bands. Thus, lower energy bands offer less resistance to electron flow.

In addition, electrons meet with less vibrational energy from the nucleus of the silicon atom, which causes them to scatter at a rate of 500 to 1,000 times less than in relaxed silicon. As a result, carrier mobility is dramatically increased in strained silicon compared to relaxed silicon, providing an increase in mobility of 80 percent or more for electrons and 20 percent or more for holes. The increase in mobility has been found to persist for current fields up to 1.5 megavolt/centimeter. These factors are believed to enable device speed increase of 35 percent without further reduction of device size, or a 25 percent reduction in power consumption without reduction in performance.

High levels of germanium at the surface of a wafer can adversely affect the formation of silicide layers. In particular, high concentration of germanium in a top surface of a substrate can adversely affect the formation of silicide layers above the source and drain regions. The germanium concentration at the top surface can be exacerbated by the processing associated with source and drain regions and gate structure formation.

Silicidation of strained silicon or germanium containing layers can be difficult. For example, the presence of germanium in a silicon layer can cause germanosilicides to form during the silicidation process. Germanosilicides negatively impact the formation of a silicide region.

After pre-cleaning native oxides from a top surface of the wafer, a metal can be deposited. The metal layer can be reacted with the semiconductor surface of the wafer to form a metal silicide ($Me_xSi_y$) region such as a titanium silicide layer, a nickel silicide layer, a cobalt silicide layer, etc. The pre-cleaning process can cause germanium contamination due to resputtering.

Thus, there is a need for an efficient process for forming silicide wafers on a wafer surface in an SMOS process. Further, there is a need for a system and a method which reduces germanium contamination of silicide regions. Even further, there is a need for a method of siliciding and a transistor architecture which avoids germanosilicides. Yet further, there is a need for a process which reduces the adverse effects of germanium on silicidation processes.

SUMMARY OF THE INVENTION

An exemplary embodiment relates to a method of manufacturing an integrated circuit. The method includes providing a gate structure between a first source location and a first drain location above a semiconductor substrate. The substrate includes a strained layer. The method also includes etching the substrate to remove the strained layer at the first source location and at the first drain location to form a recessed source location and a recessed drain location. The strained layer remains beneath the gate structure. The method also includes selectively providing a semiconductor material above a top surface of the substrate above the recessed source location and the recessed drain location, and siliciding the semiconductor material.

Another exemplary embodiment relates to a method of manufacturing an ultra-large scale integrated circuit including a transistor. The method includes steps of forming at least part of a gate structure on a top surface of a semiconductor substrate. The semiconductor substrate includes a strained silicon layer above a silicon germanium layer. The gate structure includes a bottom anti-reflective coating above a polysilicon gate conductor. The method also includes steps of removing exposed portions of the strained silicon layer to reach the silicon germanium layer, removing the bottom anti-reflective coating, growing a silicon layer above the exposed portions and above the gate conductor, and siliciding the silicon layer.

Yet another exemplary embodiment relates to a process of forming a transistor with a strained channel, an elevated source region and an elevated drain region. The process includes steps of forming gate structure on a substrate including a strained layer and removing the strained layer from a source location and a drain location, thereby leaving the strained channel underneath the gate structure. The process further includes steps of using selective epitaxial growth to provide silicon material at the source location and the drain location to form the elevated source region and the elevated drain region and siliciding the elevated source region and the elevated drain region.

BRIEF DESCRIPTION OF THE DRAWINGS

Exemplary embodiments will hereafter be described with reference to the accompanying drawings, wherein like numerals denote like elements, and.

DETAILED DESCRIPTION OF PREFERRED AND EXEMPLARY EMBODIMENTS

FIGS. 1 through 8 illustrate a method of manufacturing an integrated circuit (IC) in accordance with an exemplary embodiment. The method and IC structure illustrated in FIGS. 1 through 8 reduces the formation of germanosilicides during silicidation. The process includes at least one epitaxial step and can be used as a part of any process requiring silicidation. Advantageously, germanium associated with silicon germanium substrates and strained silicon layers does not seriously adversely affect the formation of silicide regions on the IC substrate.

Referring to FIGS. 2 through 8, a cross-sectional view of a portion 12 of an integrated circuit (IC) is illustrated. Portion 12 (FIG. 2) is subjected to process 100 (FIG. 1) to form an IC. The IC can include a transistor with a gate structure and a silicided source and drain region as explained below. Germanium contamination of silicides can be reduced through an advantageous process and transistor architecture. The architecture uses raised or elevated source and drain regions to prevent germanium from adversely affecting silicidation.

Figure 2:
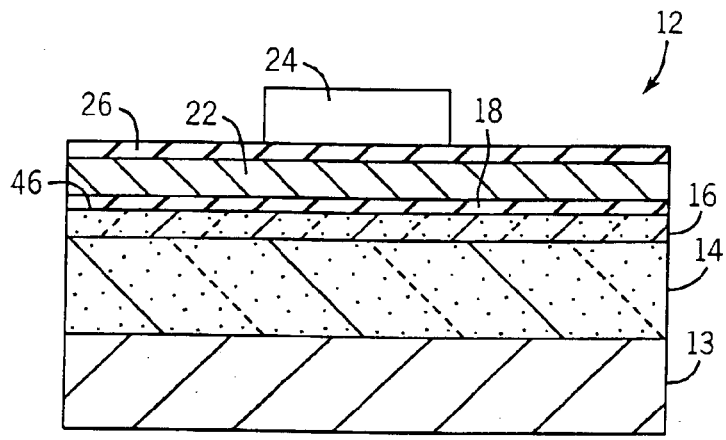
FIG. 2 is a cross-sectional view schematic drawing of a portion of the substrate used in the process illustrated in FIG. 1, the IC substrate including a lithographic feature provided above a gate stack that is above a strained silicon layer and a silicon germanium substrate.

In FIG. 2, portion 12 includes a strained silicon layer 16 provided over a semiconductor substrate 14 or a germanium containing layer or substrate. Substrate 14 can be provided above a substrate 13.

Substrate 13 is optional and portion 12 can be provided with substrate 14 as the bottom-most layer. Substrate 13 can be the same material or a different material than substrate 14. In one embodiment, substrate 13 is a semiconductor substrate such as a silicon substrate upon which silicon germanium substrate 14 has been grown. In another embodiment, substrates 13 and 14 are not included and the substrate is comprised of layer 16. In such an embodiment, layer 16 can be a silicon germanium substrate or a strained silicon substrate.

Portion 12 can be any type of semiconductor device, or portion thereof, made from any of the various semiconductor processes such as a complementary metal oxide semiconductor (CMOS) process, a bipolar process, or another semiconductor process. Portion 12 may be an entire IC or a portion of an IC including a multitude of electronic component portions.

Substrate 14 is preferably silicon germanium or another semiconductor material including germanium, and can be doped with P-type dopants or N-type dopants. Substrate 14 can be an epitaxial layer provided on a semiconductor or an insulative base, such as substrate 13. Furthermore, substrate 14 is preferably a composition of silicon germanium ($Si_{1-x}Ge_x$, where X is approximately 0.2 and is more generally in the range of 0.1–0.4). Substrate 14 can be grown or deposited.

In one embodiment, substrate 14 is grown above substrate 13 by chemical vapor deposition (CVD) using disilane ($Si_2H_6$) and germane ($GeH_4$) as source gases with a substrate temperature of approximately 650° C., a disilane partial pressure of approximately 30 mPa and a germane partial pressure of approximately 60 mPa. Growth of silicon germanium material may be initiated using these ratios, or, alternatively, the partial pressure of germanium may be gradually increased beginning from a lower pressure or zero pressure to form a gradient composition. Alternatively, a silicon layer can be doped by ion implantation with germanium, or other processes can be utilized to form substrate 14. Preferably, substrate 14 is grown by epitaxy to a thickness of less than approximately 5000 Å (and preferably between approximately 1500 Å and 4000 Å).

A strained silicon layer 16 is formed above substrate 14 by an epitaxial process. Preferably, layer 16 is grown by CVD at a temperature of approximately 600° C. Layer 16 can be a pure silicon layer and may have a thickness of between approximately 50 and 150 Å.

The substrate for portion 12 can be a semiconductor substrate such as silicon, gallium arsenide, germanium, or another substrate material. The substrate can include one or more layers of material and/or features such as lines, interconnects, vias, doped portions, etc., and can further include devices such as transistors, microactuators, microsensors, capacitors, resistors, diodes, etc. The substrate can be an entire IC wafer or part of an IC wafer. The substrate can be part of an integrated circuit such as a memory, a processing unit, an input/output device, etc.

In process 100 (FIG. 1) at step 52, gate structures are formed above substrate 14. In FIG. 2, gate structures are formed by providing a gate stack including a gate dielectric layer 18 above a top surface 46 of layer 16, a gate conductor 22, and a bottom anti-reflective (BARC) layer 26. Top surface 46 can be considered a top surface of the substrate or wafer associated with portion 12, even though surface 46 corresponds to the top surface of layer 16 in FIG. 2.

Gate dielectric layer 18 can be a 5–30 Å thick layer of thermally grown silicon dioxide. Alternatively, layer 18 can be deposited. Alternative materials for layer 18 include high-k dielectric layers, medium-k dielectric layers, silicon nitride, and other insulative materials.

Gate conductor 22 is preferably a polysilicon layer having a thickness of 700–2000 Å. Gate conductor 22 can be deposited as a P-doped or N-doped layer. Alternatively, conductor 22 can be a metal layer such as a refractory metal layer deposited by chemical vapor deposition (CVD) or sputtering.

Layer 26 is preferably an anti-reflective coating material such as silicon oxynitride (SiON) or silicon nitride ($Si_3N_4$). Alternative materials for layer 26 can also be utilized. Layer 26 serves a dual purpose of providing anti-reflective properties (e.g., as a BARC layer) as well as protecting gate conductor 22 during etching steps. Layer 26 is preferably deposited as a 250–1000 Å thick layer above gate conductor 22 by chemical vapor deposition (CVD). Alternatively, layer 26 can be thermally grown.

Photoresist feature 24 is formed above layer 26. Preferably, photoresist feature 24 is lithographically patterned to form a gate structure from gate conductor 22 and layer 18.

Figure 3:
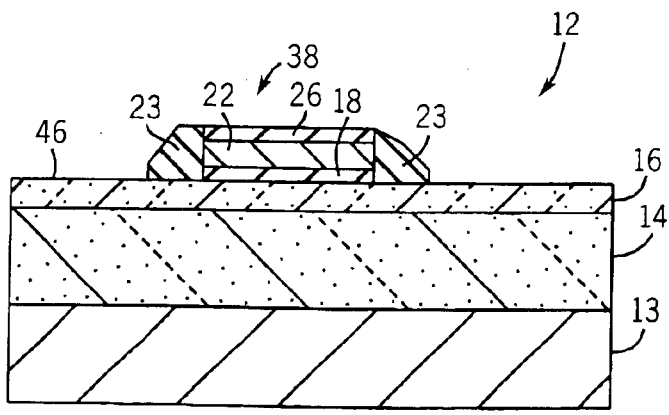
FIG. 3 is a cross-sectional view of the portion illustrated in FIG. 2, showing a gate structure formation step.

In FIG. 3, layers 26 and 18 and gate conductor 22 are etched in a conventional process to leave gate structure 38 (step 52 of process 100). Gate structure 38 can include spacers 23 formed in a deposition and etch back process. In one embodiment, spacers 23 are silicon dioxide or silicon nitride. Substrate 14 and layer 16 can be doped to provide appropriate regions such as halo regions, channel regions, and source and drain regions in step 52.

Figure 4:
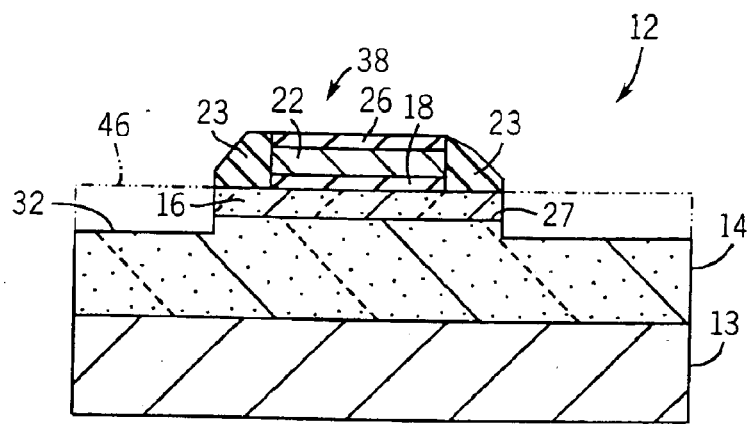
FIG. 4 is a cross-sectional view of the portion illustrated in FIG. 3, showing an etching step.

In FIG. 4, after gate structure 38 is formed, layer 16 is etched at a drain location and a source location in accordance with step 54 of process 100. Preferably, layer 16 is etched until substrate 14 beneath layer 16 is reached, thereby removing all of layer 16 at the source location and the drain location. Preferably, layer 16 is etched in an etching process selective to layer 16 with respect to spacers 23 and layer 26. Layer 16 can be etched to leave original top surface 46 of layer 16 approximately 200 Å above top surface 32 of substrate 14.

The channel region underneath gate structure 38 includes strained silicon layer 16, thereby achieving the advantages of SMOS processes. A top surface 27 of layer 14 in the channel region is the original level associated with the deposition or formation of layer 16 and substrate 14 in FIG. 2. Preferably, layer 16 is selectively etched using a hydrogen bromide (HBr) chemistry or potassium hydroxide (KOH) wet etch technique. Preferably, the etching step removes at least 200 Å of layer 16 in accordance with step 54 of process 100.

Figure 5:
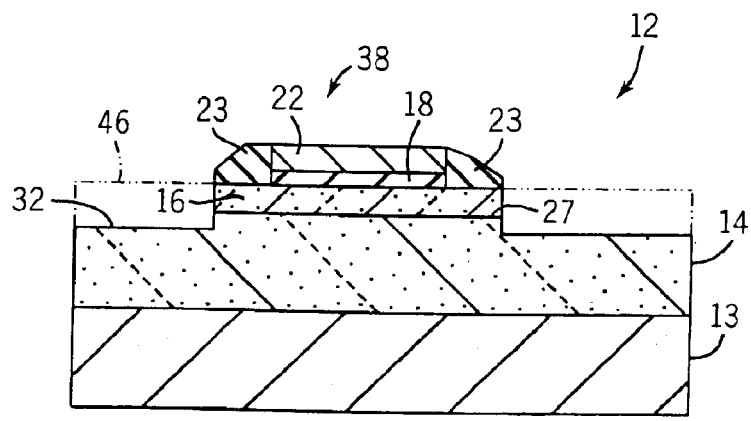
FIG. 5 is a cross-sectional view of the portion illustrated in FIG. 4, showing a coating removal step.

In FIG. 5, in accordance with step 54 of process 100, bottom anti-reflective coating (BARC) layer 26 can be removed from gate conductor 22. BARC layer 26 is preferably removed for appropriate silicidation of gate conductor 22. In one embodiment, portions of spacers 23 are also removed so that a top surface of spacer 23 is planar with a top surface of gate conductor 22. BARC layer 26 can be removed in a standard etching process, as is known in the art.

Figure 6:
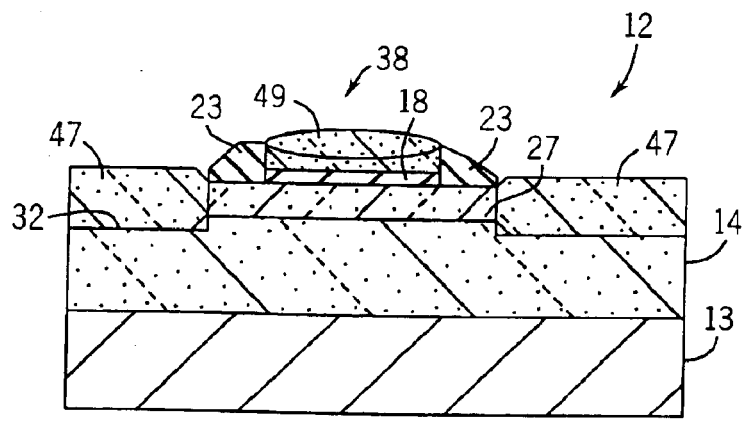
FIG. 6 is a cross-sectional view of the portion illustrated in FIG. 5, showing a selective epitaxy step.

In FIG. 6, a semiconductor layer 47 is provided at the source location and the drain location. Layer 47 is preferably single crystal silicon grown above substrate 14. Semiconductor layer 47 is preferably grown by selective epitaxy. In one embodiment, selective epitaxial growth (SEG) is applied to grow layer 47 to a thickness of 200–400 Å. In an exemplary embodiment, SEG of layer 47 may be accomplished using a dichlorosilane, hydrochloric acid, and hydrogen gas mixture. The flow rates of the gases in the mixture are approximately 0.2 standard liters per minute dichlorosilane, 0.1 standard liters per minute hydrochloric acid gas, and 20 standard liters per minute hydrogen. The gases are introduced at a pressure of approximately 20 millitorr and a temperature of between approximately 700 and 850° C. (and preferably approximately 750° C.). In other embodiments, different flow rates, pressure and/or temperatures may be used. In one embodiment, layer 47 grows from surface 32 to a level higher than the original top surface 46 of layer 16.

In an alternative embodiment, layer 47 can be a doped SEG deposited silicon layer. The doped layer can include arsenic dopants for NMOS transistors. The arsenic dopants do not have enhanced lateral diffusion because they are located in layer 47 rather than layer 16, which is strained. Preferably, layer 47 is doped with arsenic dopants to a concentration of between approximately $1 \times 10^{19}$ and $1 \times 10^{20}$ dopants per centimeter cubed. In such an embodiment, layer 16 is preferably removed to at least the depth of an extension associated with the transistor on portion 12.

In FIG. 6, a semiconductor layer 49 (e.g., silicon, etc.) is also preferably grown above gate conductor 22. Layer 49 can be grown in the same process step used to grow layer 47. Alternatively, separate steps can be utilized. Layers 47 and 49 are preferably formed in accordance with step 56.

Figure 1:
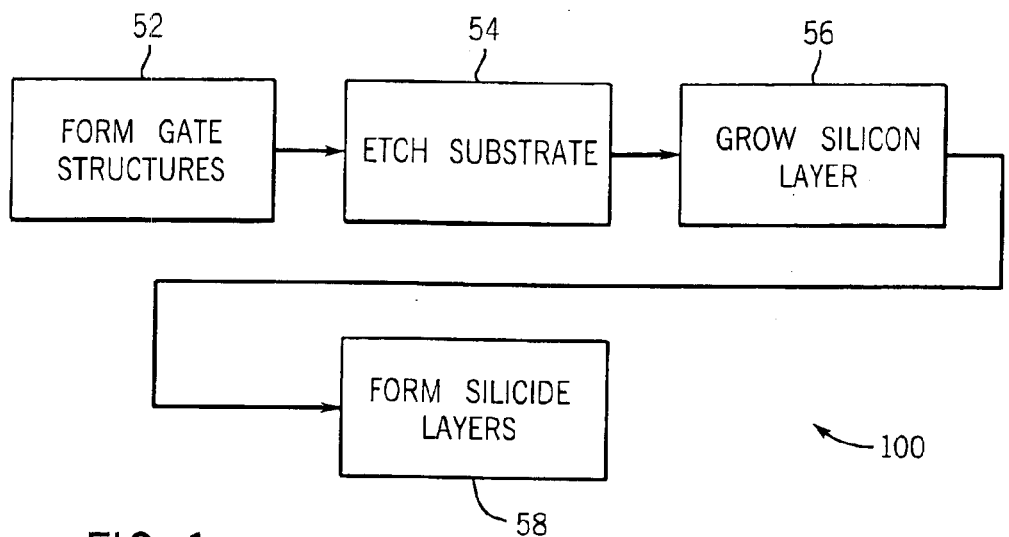
FIG. 1 is a flow diagram showing a fabrication process for a germanium-containing substrate in accordance with an exemplary embodiment.
Figure 7:
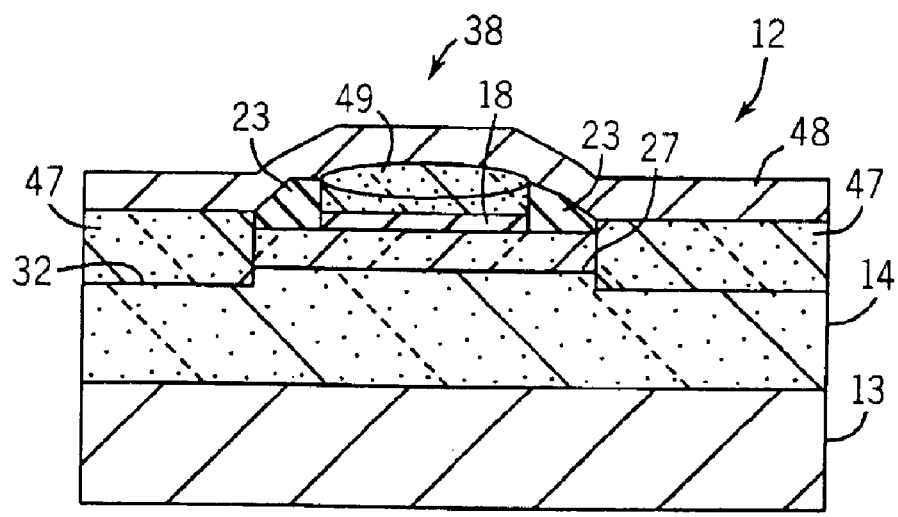
FIG. 7 is a cross-sectional view of the portion illustrated in FIG. 6, showing a metal deposition.

In FIG. 7, a metal layer 48 is deposited above layers 47 and 49 accordance with step 58 of process 100 (FIG. 1). Preferably, metal layer 48 is a 100 Å thick layer of nickel for use in a silicide process. Layer 48 can be deposited by sputtering or by chemical vapor deposition (CVD). In other exemplary embodiments, layer 48 comprises a 120 Å thick layer of cobalt or a 150 Å layer of tungsten, or another layer of material appropriate for silicidation.

Figure 8:
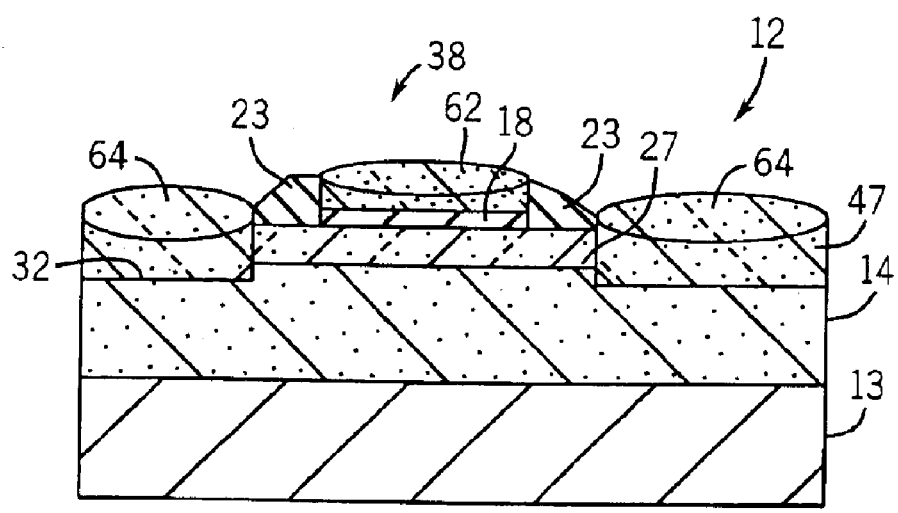
FIG. 8 is a cross-sectional view of the portion illustrated in FIG. 7, showing a silicidation step.

In accordance with step 58 of process 100, portion 12 is subject to a rapid thermal anneal at a temperature of between approximately 320° and 420° C. in a nitrogen atmosphere, selectively etched, and subjected to a second rapid thermal anneal at a temperature between approximately 400° and 600° C. in nitrogen to form silicide regions 64 and 62 (FIG. 8). Preferably, the silicide regions 64 are provided in raised source and drain regions associated with layer 47. Where different metals are used for layer 48, different annealing temperatures may be utilized. For example, where cobalt is used, the first rapid thermal anneal may be performed at a temperature of approximately 500° C. and the second rapid thermal anneal at approximately 700° C. Use of nickel for layer 48 results in formation of nickel monosilicide, while the use of cobalt results in formation of cobalt disilicide.

Alternative silicidation processes can be utilized. Due to the architecture associated with transistor portion 12 and the process steps in process 100, germanium is advantageously not present in layer 47, thereby reducing the effects of germanium in the silicidation process. Layers 47 and 49 can be approximately 250 Å thick and may consume approximately 230 Å of the underlying semiconductor layers. The use of layer 47 allows larger or thicker germanium silicon layers to be formed due to the raised nature of the source location and the drain location.

It is understood that although the detailed drawings, specific examples, and particular values given provide exemplary embodiments of the present invention, the exemplary embodiments are for the purpose of illustration only. The method and apparatus in the aforementioned embodiments are not limited to the precise details and descriptions disclosed. For example, although particular silicide techniques are described, other types of silicide processes can also be utilized. Various changes may be made to the details disclosed without departing from the scope of the invention which is defined by the following claims.

What is claimed is:

1. A method of manufacturing an integrated circuit, the method comprising:

providing a gate structure between a first source location and a first drain location above a semiconductor substrate, the substrate including a strained layer provided above a germanium-containing layer;

providing an anti-reflective material above the gate structure;

etching the substrate to remove the strained layer at the first source location and the first drain location to form a recessed source location and a recessed drain location, the strained layer remaining beneath the gate structure, the anti-reflective material remaining above the gate structure during the step of etching the substrate;

selectively providing a semiconductor material above a top surface of the substrate above the recessed source location and the recessed drain location; and siliciding the semiconductor material.

2. The method of claim 1, further comprising:

providing the semiconductor material above a gate conductor provided in the gate structure.

3. The method of claim 2, further comprising:

siliciding the semiconductor material above the gate conductor.

4. The method of claim 1, wherein the step of siliciding the semiconductor material comprises depositing a layer of material, the layer of material comprising at least one of nickel, cobalt, and tungsten.

5. The method of claim 3, wherein the selectively providing step is a silicon epitaxial growth step.

6. The method of claim 1, wherein the semiconductor material is 200–400 Angstroms thick.

7. The method of claim 6, further comprising:
providing an anti-reflective coating layer above a gate conductor of the gate structure before the providing a gate structure step.

8. The method of claim 7, further comprising:
removing the anti-reflective coating after the etching step.

9. The method of claim 1, wherein the etching step uses a KOH etching process.

10. The method of claim 1, wherein the strained layer is above a silicon germanium layer.

11. A method of manufacturing an ultra-large scale integrated circuit including a transistor, the method comprising steps of:
forming at least part of a gate structure on a top surface of a semiconductor substrate, the semiconductor substrate including a strained semiconductor layer above a silicon germanium layer, the gate structure including a bottom anti-reflective coating above a polysilicon gate conductor;
removing exposed portions of the strained semiconductor layer to reach the silicon germanium layer while the bottom anti-reflective coating is above the polysilicon gate conductor;
removing the bottom anti-reflective coating after the step of removing the exposed portions of the strained semiconductor layer;
growing a semiconductor layer above the silicon germanium layer in the location of the removed exposed portions and above the gate conductor; and
siliciding the semiconductor layer.

12. The method of claim 11, wherein the siliciding comprises providing a metal layer above the semiconductor layer and annealing.

13. The method of claim 11, wherein the strained semiconductor layer is approximately 200 Angstroms thick.

14. The method of claim 11, wherein the semiconductor layer is grown to a thickness of 200–400 Angstroms.

15. The method of claim 14, wherein the gate structure includes spacers.

16. The method of claim 15, wherein the step of removing exposed portions of the strained semiconductor layer uses a wet etch.

17. A process of forming a transistor with a strained channel, an elevated source region, and an elevated drain region, the process comprising steps of:
forming a gate structure on a substrate including a strained layer provided above a silicon germanium layer;
forming a BARC layer above the gate structure;
removing the strained layer from a source location and a drain location while the BARC layer remains above the gate structure, thereby leaving the strained channel underneath the gate structure;
using selective epitaxial growth to provide semiconductor material at the source location and the drain location to form the elevated source region and the elevated drain region; and
siliciding the elevated source region and the elevated drain region.

18. The process of claim 17, wherein the semiconductor material includes silicon.

19. The process of claim 18, further comprising:
removing the BARC layer after the step of removing the strained layer.

20. The process of claim 18, further comprising:
providing the semiconductor material above the gate structure.

21. The method of claim 1, wherein the step of selectively providing a semiconductor material comprises growing the semiconductor material by epitaxy.

22. The method of claim 11, wherein the step of growing a semiconductor layer above the silicon germanium layer comprises selective epitaxial growth of single crystal silicon.

* * * * *